United States Patent
Mi

(10) Patent No.: US 10,853,534 B2
(45) Date of Patent: Dec. 1, 2020

(54) FAULT RELATED FDC FEATURE EXTRACTION

(71) Applicant: TAIWAN SEMICONDUCTOR MANUFACTURING CO., LTD., Hsinchu (TW)

(72) Inventor: Hsin-Chao Mi, Taoyuan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 378 days.

(21) Appl. No.: 15/227,475

(22) Filed: Aug. 3, 2016

(65) Prior Publication Data

US 2017/0161412 A1     Jun. 8, 2017

Related U.S. Application Data

(60) Provisional application No. 62/262,812, filed on Dec. 3, 2015.

(51) Int. Cl.
*G06F 30/20* (2020.01)
*G01R 31/317* (2006.01)

(52) U.S. Cl.
CPC ....... *G06F 30/20* (2020.01); *G01R 31/31718* (2013.01)

(58) Field of Classification Search
CPC ................ G06F 17/5009; G06F 30/20; G01R 31/31718

USPC .............................................. 703/7
See application file for complete search history.

(56) References Cited

U.S. PATENT DOCUMENTS

| | | | | |
|---|---|---|---|---|
| 6,790,680 B1* | 9/2004 | Grover | .............. | H01L 21/67276 438/5 |
| 2004/0254762 A1* | 12/2004 | Hopkins | .................. | C23C 16/52 702/182 |
| 2005/0146716 A1* | 7/2005 | Dixon | .................. | G01N 21/278 356/237.4 |
| 2006/0095232 A1* | 5/2006 | Purdy | ................ | G05B 23/0221 702/185 |
| 2009/0317924 A1* | 12/2009 | Ouyang | ............ | H01L 21/67276 438/5 |
| 2017/0023927 A1* | 1/2017 | Kaushal | ............. | G05B 19/4065 |

* cited by examiner

*Primary Examiner* — Kamini S Shah
*Assistant Examiner* — Faraj Ayoub
(74) *Attorney, Agent, or Firm* — Maschoff Brennan

(57) ABSTRACT

A system includes at least one tool, a storage device and a processor. The at least one tool performs semiconductor fabrication processes on at least one wafer, in which the at least one tool includes sensors. The storage device stores computer program codes. The processor executes the computer program codes in the storage device for: modeling profiles from the sensors to generate a modeling result; extracting features from the modeling result corresponding to the modeled profiles; based on the extracted features, extracting scores each representing a degree of the at least one wafer being processed by the at least one tool; and based on the extracted scores, displaying a ranking for fault detection of the at least one wafer.

20 Claims, 5 Drawing Sheets

FAULT RELATED FDC FEATURE EXTRACTION

PRIORITY CLAIM AND CROSS-REFERENCE

This application claims priority to U.S. Provisional Application Ser. No. 62/262,812, filed Dec. 3, 2015, which is herein incorporated by reference.

BACKGROUND

In a semiconductor fabrication process, integrated circuit (IC) devices are formed with sequential semiconductor layers. The semiconductor fabrication process is performed with a wide variety of processing and measuring tools. The first processing tool performs various processing functions as defined, for example, by recipes for fabrication of semiconductor device.

Traditionally, fault detection and classification (FDC) matching between different tools is identified by user knowledge. For example, user identifies an abnormal situation on a FDC chart by his experience and knowledge rather than a standard criterion.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
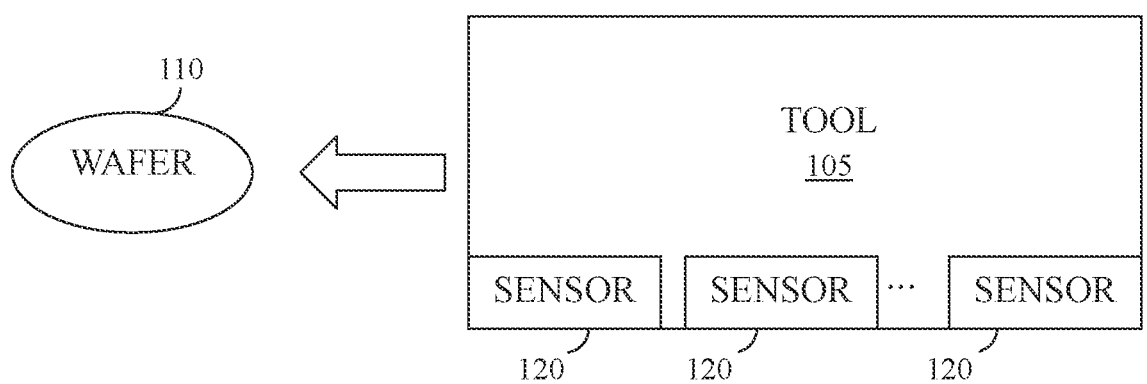
FIG. 1 is a schematic diagram of a semiconductor manufacturing system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1 is a schematic diagram of a semiconductor manufacturing system 100 in accordance with some embodiments of the present disclosure. For illustration in FIG. 1, the semiconductor manufacturing system 100 includes a tool 105. The tool 105 is configured to perform one or more semiconductor fabrication processes on a wafer 110 for semiconductor fabrication. In some embodiments, the tool 105 includes one or more semiconductor manufacturing equipments. In various embodiments, the tool 105 includes a single chamber or multiple chambers, for performing semiconductor fabrication processes. For simplicity of illustration, one tool 105 and one wafer 110 in the semiconductor manufacturing system 100 are illustrated in FIG. 1. Various numbers of tools and wafers in the semiconductor manufacturing system 100 are within the contemplated scope of the present disclosure.

In some embodiments, performing semiconductor fabrication process includes performing a number of processing operations on the wafer 110, in order to produce desired semiconductor integrated circuit (IC). For illustration, the semiconductor fabrication process includes a sequence of photolithographic and chemical processing operations.

The processing operations mentioned above include, for example, deposition, removal, patterning, and modification of electrical properties (e.g., doping). Deposition is a process, in some embodiments, that grows, coats, and/or transfers a material onto the wafer. Deposition processes or techniques include, for example, physical vapor deposition (PVD), chemical vapor deposition (CVD), electrochemical deposition (ECD), molecular beam epitaxy (MBE), atomic layer deposition (ALD), and the like. Removal is a process, in some embodiments, that removes material from the wafer, and that includes, for example, etching processes. For example, removal processes include chemical mechanical planarization (CMP) used to planarize surfaces of semiconductor structures. Patterning, also referred to as lithography, is a process, in some embodiments, that shapes deposited materials. Patterning processes include, for example, using photoresist material to selectively mask portions of semiconductor structures, exposing the semiconductor structures to a particular wavelength of light, and then washing away the unexposed regions with a developer solution. Modification of electrical properties, in some embodiments, includes doping selected regions by diffusion and/or ion implantation. For illustration, the doping processes are followed by an anneal process, including, for example, a furnace anneal or rapid thermal anneal (RTA), in order to activate the implanted dopant.

As described above, the tool 105 performs one or more semiconductor fabrication processes on the wafer 110. In some embodiments, various semiconductor fabrication processes including, for example, etching, deposition, implantation, and annealing, are performed with various tools, respectively. The tools include, for example, photolithography steppers, etch tools, deposition tools, polishing tools, rapid thermal anneal tools, ion implantation tools, and the like. Each tool is configured to perform semiconductor fabrication process on the wafer according to a corresponding recipe. For illustration, one tool is configured to deposit a film on a wafer, and the other tool is configured to etch a layer away from the wafer. Furthermore, in various embodiments, the semiconductor manufacturing system 100 includes tools of the same type, and these tools are configured to perform semiconductor fabrication processes of the same type.

In some embodiments, the tool 105 includes sensors 120 for sensing parameters including, for example, pressure, gas flows, time, temperature, impurity levels, and so on. With the parameters sensed by the sensors 120 during the semiconductor fabrication processes, profiles of the parameters are obtained. These profiles are used for fault detection and classification (FDC), as will be illustrated below. In some embodiments, the sensors 120 include, for example, a pressure sensor, a temperature sensor, a gas flow sensor, and other sensors.

The configurations of the tool 105 and the sensors 120 mentioned above are given for illustrative purposes. Various configurations of the tool 105 and the sensors 120 are within the contemplated scope of the present disclosure. Moreover, the types of the tool 105 and the sensors 120 mentioned above are given for illustrative purposes. Various configurations of the tool 105 and the sensors 120 are within the contemplated scope of the present disclosure.

Figure 2:
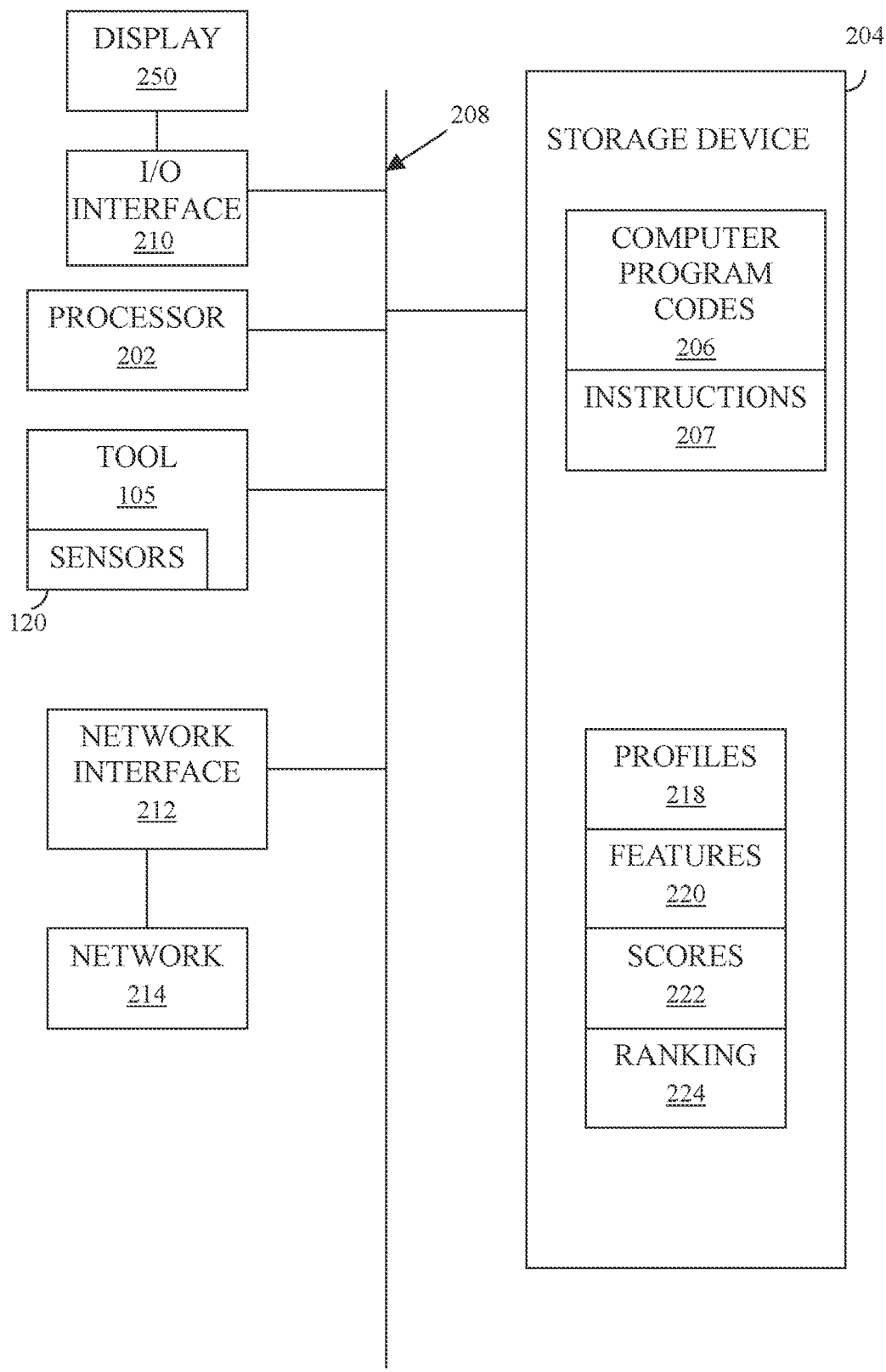
FIG. 2 is a block diagram of a system applied in the semiconductor manufacturing system in FIG. 1, in accordance with some embodiments of the present disclosure.
Figure 3:
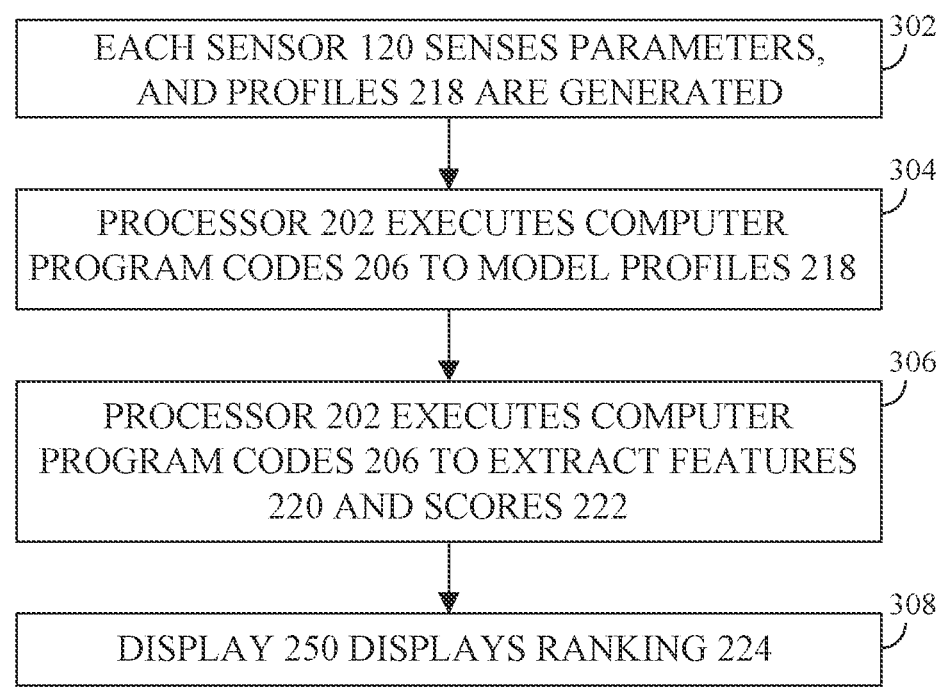
FIG. 3 is a flow chart of a method of extracting fault related FDC features associated with the semiconductor manufacturing system in FIG. 1, in accordance with some embodiments of the present disclosure.

FIG. 2 is a block diagram of a system 200 applied in the semiconductor manufacturing system 100 in FIG. 1, in accordance with some embodiments of the present disclosure. In some embodiments, the system 200 is configured to extract fault related FDC features associated with the semiconductor manufacturing system in FIG. 1. In some embodiments, the system 200 is implemented by a computing apparatus, including, for example, a computer. For illustration, the system 200 includes a processor 202 and a non-transitory computer readable storage device 204 storing computer program codes 206. The processor 202 is configured to execute the computer program codes 206 stored in the computer readable storage device 204, in order for performing operations, for example, as illustrated in FIG. 3.

In some embodiments, the processor 202 is implemented by, for example, a central processing unit (CPU), a multi-processor, a distributed processing system, an application specific integrated circuit (ASIC), a suitable processing unit, or the like. The aforementioned circuits or units to implement the processor 202 are given for illustrative purposes. Various circuits or units to implement the processor 202 are within the contemplated scope of the present disclosure.

In some embodiments, the computer readable storage device 204 is implemented by, for example, electronic, magnetic, optical, electromagnetic, infrared, and/or semiconductor device (or apparatus). For example, the computer readable storage device 204 includes a semiconductor memory, a magnetic tape, a removable computer diskette, a random access memory (RAM), a read-only memory (ROM), a rigid magnetic disk, an optical disk, and the like. For the embodiments of the computer readable storage device 204 including optical disks, the computer readable storage device 204 includes, for example, a compact disk-read only memory (CD-ROM), a compact disk-read/write (CD-R/W), a digital video disc (DVD), and the like.

In some embodiments, the computer readable storage device 204 also stores instructions 207 for interfacing with external machines and/or equipments. For illustration, the computer readable storage device 204 is encoded with the instructions 207 for interfacing with the tool 105 including the sensors 120. Accordingly, the processor 202 is able to communicate with the tool 105, thus performing, for example, a method 300 as will be illustrated in FIG. 3.

In some embodiments, the processor 202 is electrically coupled to the computer readable storage device 204 via a bus 208. Accordingly, the processor 202 is able to communicate with the computer readable storage device 204 via the bus 208.

Moreover, in some embodiments, the processor 202 also communicates with various peripheral apparatuses and/or external equipments via the bus 208. For illustration in FIG. 2, the processor 202 is electrically coupled to an I/O interface 210 via the bus 208. The I/O interface 210 is electrically coupled to peripheral apparatuses including a display 250. The display 250 is implemented by, for example, a cathode ray tube (CRT), liquid crystal display (LCD), or the like. Accordingly, the processor 202 is able to communicate with the display 250 through the I/O interface 210. Through the I/O interface 210, the processor 202 also communicates information and commands with other peripheral apparatuses including, for example, keyboard, keypad, mouse, trackball, track-pad, touch screen, cursor direction keys, and the like. The aforementioned peripheral apparatuses are given for illustrative purposes. Various peripheral apparatuses are within the contemplated scope of the present disclosure.

In some embodiments, the processor 202 is also coupled to a network interface 212 via the bus 208, in order to access a network 214 through the network interface 212. With the network 214, the processor 202 and the computer readable storage device 204 are able to communicate with external equipments and/or equipments connected to the network 214.

The network interface 212, in some embodiments, is implemented by wireless network interfaces and/or wired network interfaces. The wireless network interfaces include, for example, BLUETOOTH, WIFI, WIMAX, GPRS, WCDMA, and the like. The wired network interfaces include, for example, ETHERNET, USB, IEEE-1394, and the like.

The configuration of the system 200 in FIG. 2 is given for illustrative purposes. Various configurations of the system 200 are within the contemplated scope of the present disclosure. For example, in various embodiments, the computer readable storage device 204 is replaced by a non-transitory computer readable storage medium that is encoded with the aforementioned executable instructions and/or computer program codes for carrying out operations, for example, as illustrated in FIG. 3.

In some approaches, semiconductor fabrication processes have fault events or errors in many situations. The fault events or errors result in, for example, defects of intermediate semiconductor structures and/or end products. However, it is difficult to discover these events or errors during or after the semiconductor fabrication processes. To address the aforementioned issues, at least one method for detecting or identifying the fault events or errors is provided below in the present disclosure. For illustration, by extracting fault related FDC features that are associated with the semiconductor manufacturing system 100, the fault events or errors are able to be detected and identified. Details are explained below with reference to FIG. 3.

FIG. 3 is a flow chart of a method 300 of extracting fault related FDC features associated with the semiconductor manufacturing system 100 in FIG. 1, in accordance with some embodiments of the present disclosure. Given for illustrative purposes, the method 300 is performed with the tool 105 in FIG. 1, by the system 200 in FIG. 2. Various tools and systems for performing the method 300 are within the contemplated scope of the present disclosure.

In some embodiments, the computer readable storage device 204 stores the computer program codes 206 for performing the method 300. In various embodiments, the storage device 204 also stores various information for performing the method 300, and stores data generated during performing the method 300. For illustration, the data generated during performing the method 300 include profiles 218, features 220, scores 222, and ranking 224, as illustrated in FIG. 2 and will be described below.

Figure 4:
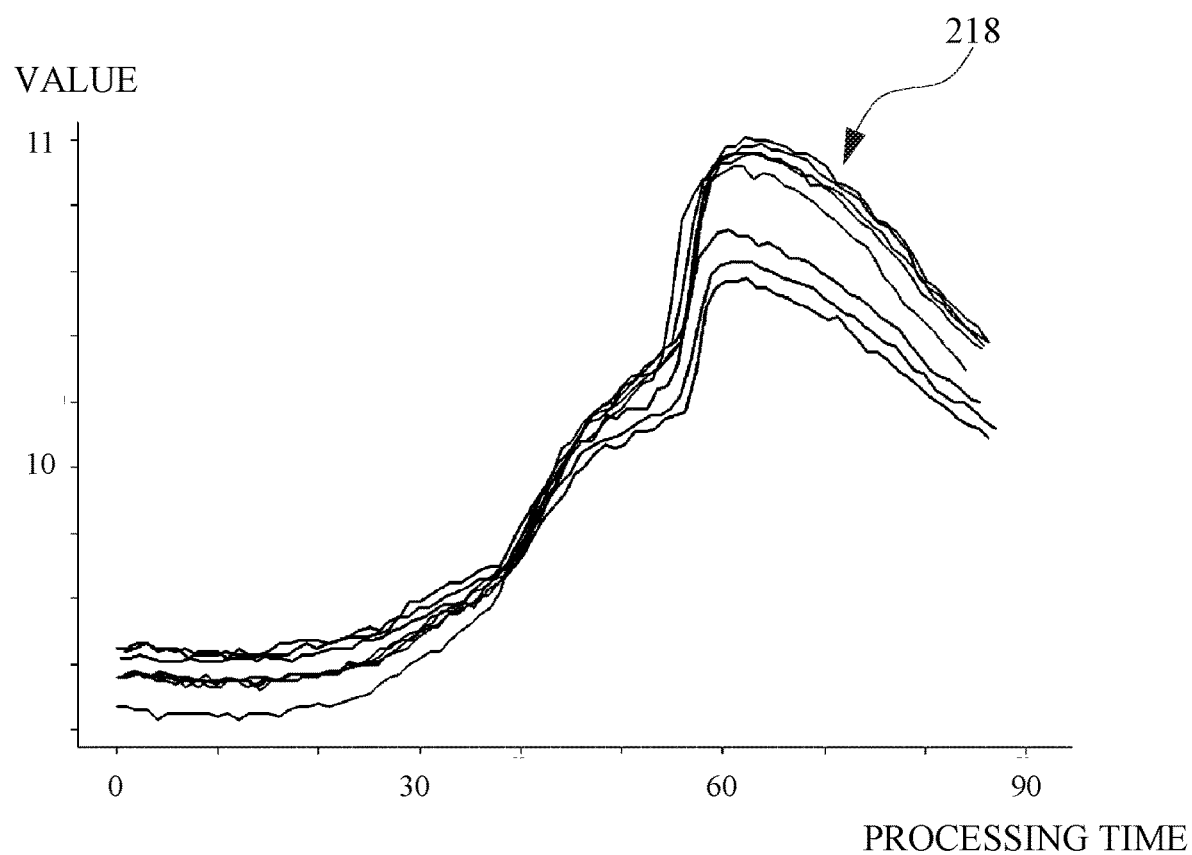
FIG. 4 is a graph illustrating profiles corresponding to parameters sensed in the semiconductor manufacturing system in FIG. 1, in accordance with some embodiments of the present disclosure.

For illustration, the sensors 120 of the tool 105 are configured to sense parameters in the semiconductor fabrication processes at various processing time. The profiles 218 corresponding to the sensed parameters are generated accordingly. FIG. 4 is a graph illustrating the profiles 218 corresponding to parameters sensed by one of the sensors 120 in FIG. 1, in accordance with some embodiments of the present disclosure. For illustration, the profiles 218 of the sensed parameters including, for example, pressure, with various values at various processing time, are shown in FIG. 4. Each one of the profiles 218 is associated with a respective wafer that is processed by the tool 105.

For illustration in FIG. 3, in operation 302, each sensor 120 of the tool 105 senses parameters in the semiconductor fabrication processes. In some embodiments, the processor 202 executes the computer program codes 206 to generate the profiles 218 based on the sensed parameters, and then the sensed parameters are stored in the computer readable storage device 204.

In operation 304, the processor 202 executes the computer program codes 206 to model the profiles 218, in order to generate a modeling result. In some embodiments, the processor 202 executes the computer program codes 206 to perform curve fitting for the profiles 218 in operation 304. For illustration, the curve fitting is a manner of constructing a curve by fitting a series of data values on one of the profiles 218. With curve fitting, the profiles 218 are transformed to various fitted curves (not shown) that are distinguishable and identifiable from each other. The modeling result is thus generated. Accordingly, differences among the profiles 218 in FIG. 4 are able to be identified.

In some approaches, profiles are summarized by a computer based on predefined statistics, including, for example, average or variance. However, differences among the profiles, for example, in FIG. 4, cannot be identified. Compared to the aforementioned approaches, in the present disclosure, the profiles 218 are modeled, and accordingly, the profiles 218 are transformed to curves that are distinguishable and identifiable from each other. As a result, behaviors or events corresponding to the profiles 218 are able to be identified.

In some embodiments, before operation 304, the system 200 (or the processor 202) identifies the tools including the tool 105, to determine whether there is any target tool that is related to fault event. If there is at least one target tool, operation 304 is then performed to model the profiles 218 corresponding to parameters from the target tool.

If there is no target tool being determined, in some embodiments, intermediate semiconductor structures and/or end products are analyzed. By the analyzing operation, whether there is any fault event occurred during the semiconductor fabrication processes is re-checked. For illustration, when a semiconductor structure is analyzed and has a defect portion, the system 200 (or the processor 202) determines whether the defect portion of the semiconductor structure is associated with the tool 105. If yes, the tool 105 is identified as the target tool. Operation 304 is then performed to model the profiles 218 corresponding to parameters from the tool 105.

In various embodiments, if there is no target tool being determined, analysis is made, for example by the processor 202, to parameters from the tools. By the operation of analyzing the sensed parameters, whether there is any fault event corresponding to at least one of the tools is re-checked. For illustration, when fault event occurs, the processor 202 analyzes the parameters from the tool 105, to determine whether the fault event is associated with the tool 105. If yes, the tool 105 is thus identified as the target tool. Operation 304 is then performed to model the profiles 218 corresponding to the sensed parameters from the tool 105.

Referring back to FIG. 3, in operation 306, the processor 202 executes the computer program codes 206 to extract features 220 from the modeling result corresponding to the profiles 218. The extracted features 220 are stored in the computer readable storage device 204 and include feature values reflecting the profiles 218. For illustration, the sensors 120 include four sensors IND1, IND2, IND3, and IND4. Table 1 shown below lists values of the extracted features 220 of four sensors IND1, IND2, IND3, and IND4 for each wafer. In some embodiments, the values of the extracted features 220 include, for example, curve fitting values.

TABLE 1

| WAFER ID | IND1 | IND2 | IND3 | IND4 |
| --- | --- | --- | --- | --- |
| wafer 1 | 13.77 | 9.11 | −0.76 | 0.19 |
| wafer 2 | 13.06 | 8.31 | −0.53 | 0.46 |
| wafer 3 | 13.96 | 9.22 | −0.93 | 0.16 |
| wafer 4 | 13.71 | 8.59 | −1.01 | 0.32 |
| wafer 5 | 14.63 | 9.16 | −0.92 | 0.41 |
| wafer 6 | 13.75 | 8.86 | −0.71 | 0.28 |
| wafer 7 | 13.96 | 8.85 | −0.78 | 0.33 |
| wafer 8 | 13.73 | 8.75 | −0.81 | 0.32 |

For illustration in Table 1, the tool 105 performs the semiconductor fabrication processes for different wafers 1-8. The profiles 218 corresponding to each of the wafers 1-8 are obtained with respect to the sensors IND1, IND2, IND3, and IND4. Feature values corresponding to the modeling result obtained from the profiles 218 are then extracted, for example, shown in Table 1.

The feature values in Table 1 are illustrated below. For the sensor IND1 in Table 1, the feature values 13.77, 13.06, 13.96, 13.71, 14.63, 13.75, 13.96, and 13.73 reflect the modeled profiles corresponding to the wafers 1-8, respectively. For the sensor IND2 in Table 1, the feature values 9.11, 8.31, 9.22, 8.59, 9.16, 8.86, 8.85, and 8.75 reflect the modeled profiles corresponding to the wafers 1-8, respectively. For the sensor IND3 in Table 1, the feature values −0.75, −0.53, −0.93, −1.01, −0.92, −0.71, −0.78, and −0.81 reflect the modeled profiles corresponding to the wafers 1-8, respectively. For the sensor IND4 in Table 1, the feature values 0.19, 0.46, 0.16, 0.32, 0.41, 0.28, 0.33, and 0.32 reflect the modeled profiles corresponding to the wafers 1-8, respectively.

Moreover in operation 306, the processor 202 executes the computer program codes 206 to extract scores 222 based on the extracted features 220 corresponding to the modeled profiles 218. For illustration, the processor 202 calculates the values of the extracted features 220, and extracts the corresponding scores 222 according to the calculation result. The aforementioned operation of extracting the scores 222 is also referred to as computing and obtaining the scores 222 in some embodiments. Exemplary embodiments associating with extracting the corresponding scores 222 are discussed for illustration with reference to FIGS. 5-8 below.

In some embodiments, the processor 202 extracts the scores 222 by categorizing the extracted features 220. For illustration, the values of the extracted features 220 are categorized into a first group of values corresponding to defective wafers, and a second group of values corresponding to normal wafers. The processor 202 analyzes correlations between the first and second group of values, to determine the corresponding scores 222. Alternatively stated, the scores 222 are extracted by categorizing the values of the extracted features 220. Exemplary embodiments associating with the aforementioned illustration are discussed with reference to FIGS. 5-8 below.

The aforementioned embodiments of extracting the scores 222 are given for illustrative purposes. Various embodiments of extracting the scores 222 are within the contemplated scope of the present disclosure. For example, in various embodiments, the processor 202 executes the computer program codes 206 to compare the values of the extracted features 220 corresponding to the wafers 1-8, in order to determine the scores 222.

In alternative embodiments, the wafers 1-8 include defective wafers and normal wafers. In such embodiments, the processor 202 executes the computer program codes 206 to calculate or analyze correlations between values of the extracted features 220 corresponding to the defective wafers and the normal wafers. Based on the correlations, the scores 222 are determined. Correlations between values of the extracted features 220 corresponding to the defective and normal wafers are discussed with reference to FIGS. 5-8 below.

Figure 5:
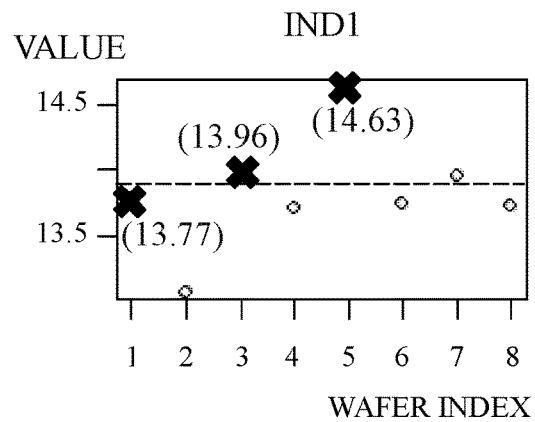
FIGS. 5-8 are plots of feature values extracted from the semiconductor manufacturing system in FIG. 1, in accordance with some embodiments of the present disclosure.

FIG. 5 is a plot of the feature values in Table 1, corresponding to the wafers 1-8 associated with the sensor IND1, in accordance with some embodiments of the present disclosure. For illustration in FIG. 5, the wafer 1, the wafer 3 and the wafer 5 are defective wafers, and the other wafers are normal wafers. As illustratively shown in FIG. 5, the highest feature value 14.63 corresponding to the defective wafer 5 is clearly distinguishable from the feature values corresponding to the normal wafers 2, 4 and 6-8. The second highest feature value 13.96 corresponding to the defective wafer 3 is equal to the feature value 13.96 corresponding to the normal wafer 7. The feature value 13.77 corresponding to the defective wafer 1 is between the feature values 13.75 and 13.96 corresponding to the normal wafers 6 and 7, respectively. Based on the differences between the feature values in FIG. 5, the processor 202 identifies that only one feature value 14.63 corresponding to the defective wafer 5 is clearly distinguishable from the feature values corresponding to the normal wafers 2, 4 and 6-8. Accordingly, the processor 202 calculates or analyzes the feature values in FIG. 5 to determine the corresponding score 222. The score 222 corresponding to the feature values in FIG. 5 is, for example, 0.75. The corresponding score 222 of 0.75 indicates, for illustration, a medium degree of distinguishing all of the defective wafers 1, 3 and 5 from the normal wafers 2, 4 and 6-8.

Figure 6:
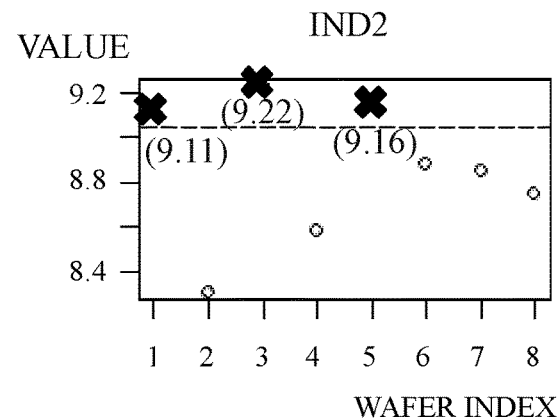

FIG. 6 is a plot of the feature values in Table 1, corresponding to the wafers 1-8 associated with the sensor IND2, in accordance with some embodiments of the present disclosure. For illustration in FIG. 6, the wafer 1, the wafer 3 and the wafer 5 are defective wafers, and the other wafers are normal wafers. As illustratively shown in FIG. 6, the feature values corresponding to the defective wafers 1, 3 and 5 are close to each other. The highest feature value 9.22 corresponding to the defective wafer 3 is clearly distinguishable from the feature values corresponding to the normal wafers 2, 4 and 6-8. The second highest feature value 9.16 corresponding to the defective wafer 5 is clearly distinguishable from the feature values corresponding to the normal wafers 2, 4 and 6-8. The third highest feature value 9.11 corresponding to the defective wafer 1 is also clearly distinguishable from the feature values corresponding to the normal wafers 2, 4 and 6-8. Based on the differences between the feature values in FIG. 6, the processor 202 identifies that the feature values corresponding to the defective wafers 1, 3 and 5 are distinguishable from the feature values corresponding to the normal wafers 2, 4 and 6-8. Accordingly, the processor 202 calculates or analyzes the feature values in FIG. 6 to determine the corresponding score 222. The score 222 corresponding to the feature values in FIG. 6 is, for example, 1. The corresponding score 222 of 1 indicates, for illustration, a high degree of distinguishing all of the defective wafers 1, 3 and 5 from the normal wafers 2, 4 and 6-8.

Figure 7:
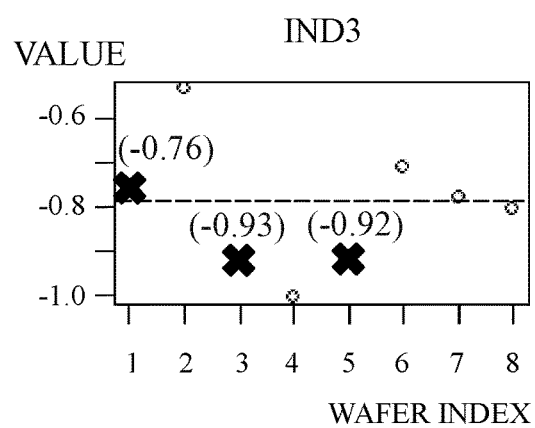

FIG. 7 is a plot of the feature values in Table 1, corresponding to the wafers 1-8 associated with the sensor IND3, in accordance with some embodiments of the present disclosure. For illustration in FIG. 7, the wafer 1, the wafer 3 and the wafer 5 are defective wafers, and the other wafers are normal wafers. As illustratively shown in FIG. 5, the feature value −0.76 corresponding to the defective wafer 1 is between two feature values −0.71 and −0.78 corresponding to the normal wafers 6 and 7, respectively. The feature value −0.93 corresponding to the defective wafer 3 is between two feature values −0.53 and −1.01 corresponding to the normal wafers 2 and 4, respectively. The feature value −0.92 corresponding to the defective wafer 5 is also between two feature values −0.53 and −1.01 corresponding to the normal wafers 2 and 4, respectively. Based on the differences between the feature values in FIG. 7, the processor 202 identifies that the feature values corresponding to the defective wafers 1, 3 and 5 are not completely distinguishable from the feature values corresponding to the normal wafers 2, 4 and 6-8. Accordingly, the processor 202 calculates or analyzes the feature values in FIG. 6 to determine the corresponding score 222. The score 222 corresponding to the feature values in FIG. 6 is, for example, 0.75. The corresponding score 222 of 0.75 indicates, for illustration, a medium degree of distinguishing all of the defective wafers 1, 3 and 5 from the normal wafers 2, 4 and 6-8.

Figure 8:
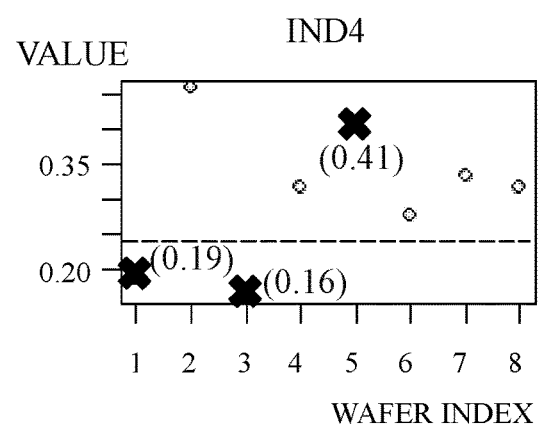

FIG. 8 is a plot of the feature values in Table 1, corresponding to the wafers 1-8 associated with the sensor IND4, in accordance with some embodiments of the present disclosure. For illustration in FIG. 8, the wafer 1, the wafer 3 and the wafer 5 are defective wafers, and the other wafers are normal wafers. As illustratively shown in FIG. 8, there is a large difference between the feature values corresponding to the defective wafers 3 and 5. The feature value 0.19 corresponding to the defective wafer 1 is smaller than any one of the feature values corresponding to the normal wafers 2, 4 and 6-8. The feature value 0.16 corresponding to the defective wafer 3 is also smaller than any one of the feature values corresponding to the normal wafers 2, 4 and 6-8. The feature value 0.41 corresponding to the defective wafer 5 is between two feature values 0.46 and 0.32 corresponding to the normal wafers 2 and 4, respectively. Based on the differences between the feature values in FIG. 8, the processor 202 identifies that the feature values corresponding to the defective wafers 1, 3 and 5 are less distinguishable from the feature values corresponding to the normal wafers 2, 4 and 6-8. Accordingly, the processor 202 calculates or analyzes the feature values in FIG. 8 to determine the corresponding score 222. The score 222 corresponding to the feature values in FIG. 8 is, for example, 0.36. The corresponding score 222 of 0.36 indicates, for illustration, a low degree of distinguishing all of the defective wafers 1, 3 and 5 from the normal wafers 2, 4 and 6-8.

In view of the above, the scores 222 are extracted by comparing the feature values corresponding to the wafers 1-8, or alternatively, by calculating correlations between the feature values corresponding to the defective wafers and the normal wafers. Table 2 shown below lists the scores 222 corresponding to the four sensors IND1, IND2, IND3, and IND4. In some embodiments, the processor 202 executes the computer program codes 206 to generate the ranking 224 based on the scores 222. For illustration, in the Table 2, the scores 222 corresponding to the sensors IND2, IND1 IND3, and IND4 are ranked as $1^{st}$, $2^{nd}$, $2^{nd}$, and $4^{th}$, respectively, in which the scores 222 corresponding to the sensors IND1 and IND3 are of the same rank.

TABLE 2

| IND1 | 0.75 |
|------|------|
| IND2 | 1    |
| IND3 | 0.75 |
| IND4 | 0.36 |

Referring back to FIG. 3, after operation 306, operation 308 is performed. In operation 308, the display 250 displays the ranking 224 corresponding to the scores 222. Accordingly, in view of the ranking 224, the profiles 218 are able to be distinguished from each other, for example, by utilizing the scores 222.

In some embodiments, the processor 202 transmits the ranking 224, through the network interface 212 and the network 214, to equipments connected to the network 214, for notification of fault detection and classification (FDC).

The above illustrations in FIG. 3 include exemplary operations, but the operations are not necessarily performed in the order shown. Operations may be added, replaced, changed order, and/or eliminated as appropriate, in accordance with the spirit and scope of various embodiments of the present disclosure.

The processor 202 performing the operations in the present disclosure is given for illustrative purposes. Various devices or systems for performing the operations are within the contemplated scope of the present disclosure. For example, in alternative embodiments, the entire system 200 illustrated in FIG. 2 is also referred to as being configured to perform the operations in the present disclosure.

In various embodiments, the method 300 is performed by several systems including the system 200. In such embodiments, the profiles 218, features 220, scores 222, and ranking 224 discussed above are transmitted between the systems through the network 214.

In some embodiments, a system is disclosed that includes at least one tool, a storage device and a processor. The at least one tool is configured to perform semiconductor fabrication processes on at least one wafer, in which the at least one tool includes a plurality of sensors. The storage device is configured to store computer program codes. The processor is configured to execute the computer program codes in the storage device for: modeling profiles from the sensors to generate a modeling result; extracting features from the modeling result corresponding to the modeled profiles; based on the extracted features, extracting scores each representing a degree of the at least one wafer being processed by the at least one tool; and based on the extracted scores, displaying a ranking for fault detection of the at least one wafer.

Also disclosed is a non-transitory computer readable medium that includes computer executable instructions which, when executed by a processor, cause the processor for carrying out a method. The method comprises modeling profiles from sensors of at least one tool to generate a modeling result, in which the at least one tool is configured to perform semiconductor fabrication processes on at least one wafer; extracting features from the modeling result corresponding to the modeled profiles; based on the extracted features, extracting scores each representing a degree of the at least one wafer being processed by the at least one tool; and based on the extracted scores, displaying a ranking for fault detection of the at least one wafer.

Also disclosed is a method that includes sensing parameters by sensors of at least one tool configured to perform semiconductor fabrication processes on at least one wafer; based on the sensed parameters, generating profiles; modeling the profiles to generate a modeling result; extracting features from the modeling result corresponding to the modeled profiles; based on the extracted features, extracting scores each representing a degree of the at least one wafer being processed by the at least one tool; and based on the extracted scores, displaying a ranking for fault detection of the at least one wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   at least one tool configured to perform semiconductor fabrication processes on a plurality of wafers, wherein the at least one tool comprises a plurality of sensors;
   a storage device configured to store computer program codes; and
   a processor configured to execute the computer program codes in the storage device for:
     identifying whether there is any target tool in the at least one tool that is related to a fault event;
     when there is at least one target tool identified to be related to the fault event: modeling profiles from the sensors, to generate a modeling result;

extracting features from the modeling result corresponding to the modeled profiles;
based on the extracted features, extracting scores each representing a degree of distinguishing the plurality of wafers being processed by the at least one tool;
based on the extracted scores, displaying a ranking of the plurality of sensors for fault detection of the plurality of wafers; and
based on the ranking of the plurality of sensors for fault detection of the plurality of wafers, identifying that at least one normal wafer of the plurality of wafers is not defective,
wherein extracting scores comprises calculating correlations between values of the extracted features corresponding to at least one defective wafer of the plurality of wafers and the at least one normal wafer of the plurality of wafers,
wherein in response to the at least one normal wafer of the plurality of wafers not being defective, the at least one tool performs semiconductor fabrication processes on the at least one normal wafer of the plurality of wafers.

2. The system of claim 1, wherein modeling profiles comprises:
performing a curve fitting for the profiles to transform the profiles to identifiable curves.

3. The system of claim 1, wherein the processor is further configured to execute the computer program codes for generating the profiles based on parameters that are sensed by the sensors.

4. The system of claim 1, wherein the at least one tool further comprises at least one semiconductor manufacturing equipment for processing the plurality of wafers.

5. A non-transitory computer readable medium comprising computer executable instructions which, when executed by a processor, cause a system to perform operations, the operations comprising:
identifying at least one tool to determine whether there is any target tool that is related to a fault event;
when there is at least one target tool identified to be related to the fault event: modeling profiles from sensors of the at least one tool to generate a modeling result, wherein the at least one tool is configured to perform semiconductor fabrication processes on a plurality of wafers;
extracting features from the modeling result corresponding to the modeled profiles;
based on the extracted features, extracting scores each representing a degree of distinguish at least one defective wafer of the plurality of wafers from at least one normal wafer of the plurality of wafers;
based on the extracted scores, displaying a ranking of the sensors for fault detection of the plurality of wafers;
based on the ranking of the sensors for fault detection of the plurality of wafers, identifying the at least one normal wafer of the plurality of wafers is not defective; and
based on the at least one normal wafer of the plurality of wafers not being defective, controlling the at least one tool to perform semiconductor fabrication processes on the at least one normal wafer of the plurality of wafers,
wherein extracting scores comprises calculating correlations between values of the extracted features corresponding to the at least one defective wafer and the at least one normal wafer of the plurality of wafers.

6. The non-transitory computer readable medium of claim 5, wherein modeling profiles comprises:
performing a curve fitting for the profiles to transform the profiles to curves that are identifiable from each other.

7. The non-transitory computer readable medium of claim 5, wherein the operations further comprise:
generating the profiles based on parameters that are sensed by the sensors.

8. A method comprising:
sensing parameters by sensors of at least one tool configured to perform semiconductor fabrication processes on a plurality of wafers;
based on the sensed parameters, generating profiles;
identifying the at least one tool to determine whether there is any target tool that is related to a fault event;
when there is at least one target tool identified to be related to the fault event: modeling the profiles to generate a modeling result;
extracting features from the modeling result corresponding to the modeled profiles;
based on the extracted features, extracting scores each representing a degree of distinguishing at least one defective wafer of the plurality of wafers from at least one normal wafer of the plurality of wafers;
based on the extracted scores, displaying a ranking of the sensors for fault detection of the plurality of wafers; and
based on the ranking of the sensors for fault detection of the plurality of wafers, identifying that the at least one normal wafer of the plurality of wafers is not defective,
wherein extracting scores comprises calculating correlations between values of the extracted features corresponding to the at least one defective wafer and the at least one normal wafer of the plurality of wafers, and
wherein in response to the at least one normal wafer of the plurality of wafers not being defective, the at least one tool performs semiconductor fabrication processes on the at least one normal wafer of the plurality of wafers.

9. The method of claim 8, wherein modeling the profiles comprises:
performing a curve fitting for the profiles to transform the profiles to curves that are identifiable from each other.

10. The method of claim 8, wherein extracting scores further comprises:
comparing the values of the extracted features.

11. The method of claim 8, wherein the at least one tool further comprises at least one semiconductor manufacturing equipment for processing the at least one normal wafer of the plurality of wafers.

12. The system of claim 1, wherein when there is the at least one target tool, extracting scores comprises:
comparing the extracted features corresponding to the at least one target tool with the extracted features corresponding to the at least one tool not including the at least one target tool.

13. The non-transitory computer readable medium of claim 5, wherein extracting scores further comprises: comparing the values of the extracted features with each other.

14. The method of claim 8, wherein sensing parameters is performed during the semiconductor fabrication processes.

15. The system of claim 1, wherein extracting scores further comprises:
categorizing the extracted features into groups of the values, wherein a first group of the groups of the values corresponds to the at least one defective wafer of the plurality of wafers, and a second group of the groups of the values corresponds to the at least one normal wafer of the plurality of wafers.

16. The method of claim 8, wherein extracting scores further comprises:
   categorizing the extracted features into a first group of the values and a second group of the values.

17. The method of claim 16, wherein the first group of the values corresponds to the at least one defective wafer of the plurality of wafers, and the second group of the values corresponds to the at least one normal wafer of the plurality of wafers.

18. The system of claim 1, wherein calculating correlations comprises:
   calculating differences between the values of the extracted features corresponding to the at least one defective wafer and the at least one normal wafer of the plurality of wafers.

19. The non-transitory computer readable medium of claim 5, wherein calculating correlations comprises:
   calculating differences between the values of the extracted features corresponding to the at least one defective wafer and the at least one normal wafer of the plurality of wafers.

20. The method of claim 8, wherein calculating correlations comprises:
   calculating differences between the values of the extracted features corresponding to the at least one defective wafer and the at least one normal wafer of the plurality of wafers.

* * * * *